US006821910B2

(12) United States Patent
Adomaitis et al.

(10) Patent No.: US 6,821,910 B2
(45) Date of Patent: Nov. 23, 2004

(54) SPATIALLY PROGRAMMABLE MICROELECTRONICS PROCESS EQUIPMENT USING SEGMENTED GAS INJECTION SHOWERHEAD WITH EXHAUST GAS RECIRCULATION

(75) Inventors: Raymond A. Adomaitis, Washington, DC (US); John N. Kidder, Jr., Randolph, VT (US); Gary W. Rubloff, Clarksville, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 10/333,784

(22) PCT Filed: Jul. 23, 2001

(86) PCT No.: PCT/US01/23137

§ 371 (c)(1),
(2), (4) Date: Jan. 24, 2003

(87) PCT Pub. No.: WO02/08487

PCT Pub. Date: Jan. 31, 2002

(65) Prior Publication Data

US 2004/0099213 A1 May 27, 2004

Related U.S. Application Data

(60) Provisional application No. 60/220,231, filed on Jul. 24, 2000.

(51) Int. Cl.[7] .................. H01L 21/469; H01L 21/31
(52) U.S. Cl. .................. 438/758; 438/681; 118/715
(58) Field of Search .................. 118/715, 665; 427/10; 438/680, 681, 758

(56) References Cited

U.S. PATENT DOCUMENTS 4,209,357 A    6/1980 Gorin

| 4,993,358 A | * | 2/1991 | Mahawili .................. 118/715 |
|---|---|---|---|
| 5,076,207 A | | 12/1991 | Washitani |
| 5,304,247 A | * | 4/1994 | Kondo et al. .................. 118/715 |
| 5,422,139 A | | 6/1995 | Fischer |
| 5,453,124 A | | 9/1995 | Moslehi |
| 5,558,717 A | | 9/1996 | Zhao |
| 6,190,732 B1 | | 2/2001 | Omstead |

FOREIGN PATENT DOCUMENTS

| JP | 62-211912 | 9/1987 |
|---|---|---|
| JP | 3-151629 | 6/1991 |
| JP | 3-281780 | 12/1991 |

OTHER PUBLICATIONS

Herman, Irving P.; Optical Diagnostics for Thin Film Processing; Academic Press, San Diego California, 1996, pp. 352–363.

* cited by examiner

Primary Examiner—Alexander Ghyka
(74) Attorney, Agent, or Firm—Liniak, Berenato & White

(57) ABSTRACT

A multizone, segmented showerhead provides a gas impingement flux distribution which is controllable in two lateral dimensions to achieve programmable uniformity in chemical vapor deposition, in plasma deposition and etching and other processes. Recirculation (pumping) of exhaust gases back through the showerhead reduces intersegment mixing to achieve a high degree of spatial control of the process. This spatial control of the impinging gas flux distribution assures that uniformity can be achieved at process design points selected to optimize materials performance. Spatial control also permits rapid experimentation by enabling the introduction of intentional nonuniformities so that combinatorial data from across the wafer/substrate provides results of simultaneous experiments at different process design points. This ability is useful for process tuning and optimization in manufacturing or for rapid materials and process discovery and optimization in research and development.

52 Claims, 14 Drawing Sheets

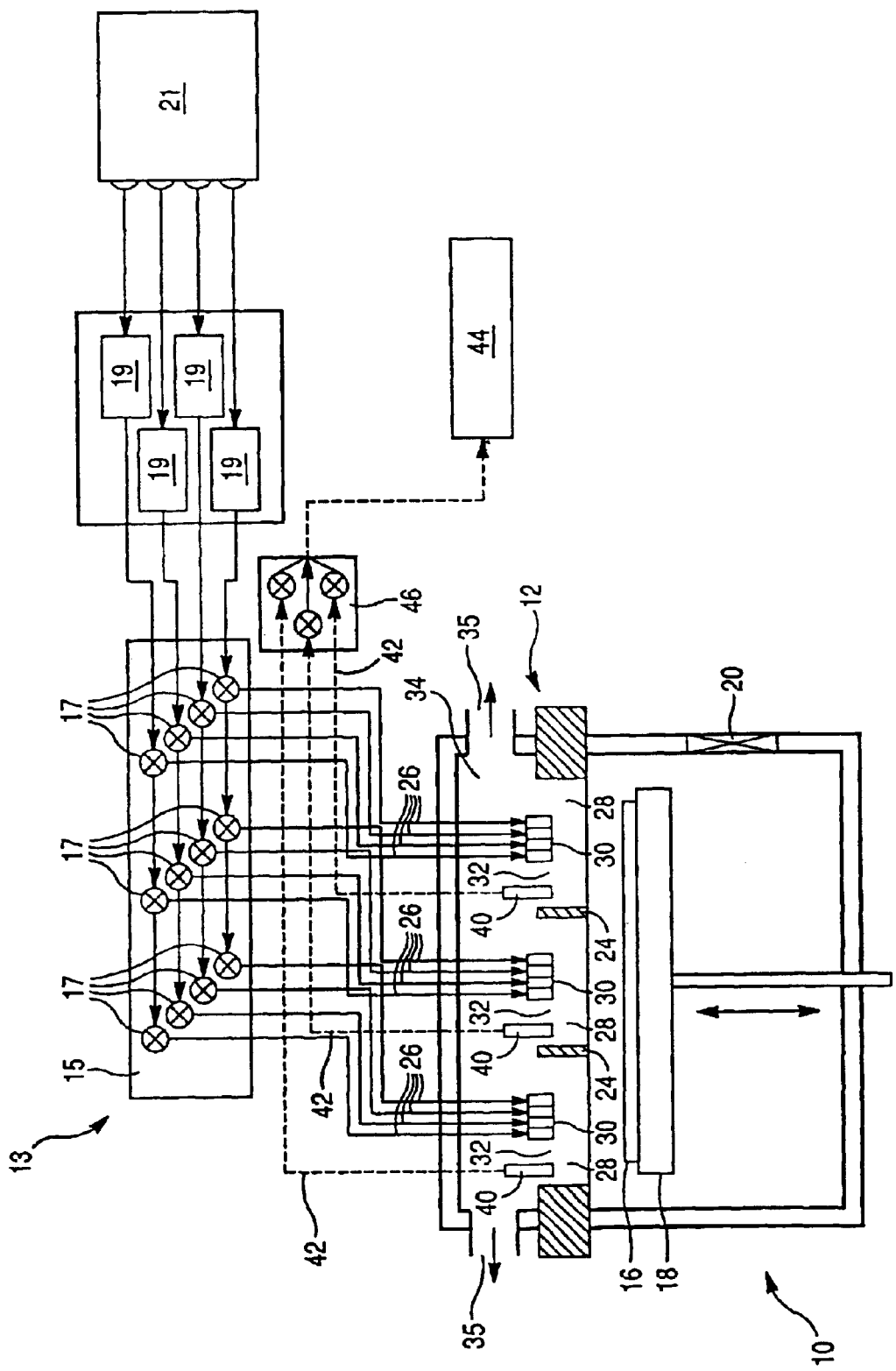

Fig. 8A feed_pgrm.m
% Showerhead feed gas setup

```
  S1h = findobj(gcbf,'Tag','Slider1');
  Cin(1) = Cfeed*get(S1h,'Value');
  S2h = findobj(gcbf,'Tag','Slider2');
  Cin(2) = Cfeed*get(S2h,'Value');
  S3h = findobj(gcbf,'Tag','Slider3');
  Cin(3) = Cfeed*get(S3h,'Value');
%  S4h = findobj(gcbf,'Tag','Slider4');
%  Cin(4) = Cfeed*get(S4h,'Value');

for segments = 1:length(Cin)
   g(:,:,segments) = zeros(length(x),length(y));
   for i=1:length(x), for j=1:length(y)
      if (x(i)-centers(segments,1))^2+(y(j)-centers(segments,2))^2 ...
           < segrad^2, g(i,j,segments)=1.0; end
      end, end
   gtot(:,:,segments) = g(:,:,segments)*Cin(segments);
   end subplot(2,2,2)
surf(y,x,sum(gtot,3))
caxis([0 0.75*Cfeed]);
theta = [0:0.03:2*pi]';
%Xwedge = Rdim*cos(theta) + 0.5; % I'm not sure why I had to offset the center
Xwedge = Rdim*cos(theta) + 0.515;
Ywedge = Rdim*sin(theta) + 0.5;
Zwedge = zeros(size(theta)) + 2*max(max(sum(gtot,3)));

view(2)
hold on
plot3(Xwedge,Ywedge,Zwedge,'k','LineWidth',3)
hold off colorbar
title('Showerhead/wafer arrangement','FontSize',14)

setup_prgm.m
clear
```

Fig. 8B (Cont. from Fig. 8A)

addpath /afs/glue.umd.edu/department/isr/labs/cacse/A_team/matlab/devel
% Reactor and reaction parameters

| | |
|---|---|
| % h = 0.01; | % (m) wafer/showerhead spacing |
| h = 0.02; | % (m) wafer/showerhead spacing |
| w = 0.3; | % (m) chamber width (x direction) |
| d = 0.4; | % (m) chamber length (y direction) |
| R = 0.1; | % (m) wafer diameter |
| Rdim = 0.25; | % dimensionless wafer radius |

Dw = 0.002;        % (m^2/s) diffusion coeff of WF6 in H2
alpha = 0.75;      % (dimless) thermal diffusion factor for WF6 in H2
Tw = 400 + 273;    % (K) wafer temperature
Tref = 273;        % (K) reference temperature
delT = Tref - Tw;  % (K) temp difference Rg = 8.314;        % (J/gmol/K) gas constant
Rg1 = 82.057e-6;   % (m^3 atm/gmol/K) gas contant
Ptot = 1/760;      % (atm) gas pressure
Ptot1 = 1.01325e5/760; % (Pa) gas pressure rho = 19.3*100^3;  % (g/m^3) W density
MW = 183.84;       % (g/gmol)

Cref = Ptot/Rg1/Tref;  % (gmol/m^3) reference gas conc
Cfeed = 0.10;      % Max feed WF6 mole fraction cH = 1.7;          % (gmol/Pa^(1/2)/m^2/s)
Ea = 69000;        % (J/gmol)
Q = 0.0278;        % (m^3/s) total feed gas flow rate K = cH*sqrt(0.9*Ptot1)*exp(-Ea/Rg/Tw);

% Adjustable parameters

%centers = [0.3 0.5; 0.5 0.3; 0.5 0.7; 0.7 0.5];
%centers = [0.98-0.378 0.378; 0.98-0.622 0.5; 0.98-0.378 0.622];
centers = [0.98-0.382 0.377; 0.98-0.626 0.5; 0.98-0.382 0.621];

Fig. 8C (Cont. from Fig. 8B)

```
%segrad = 0.15;
segrad = 0.135;

%nx = 38;
%ny = 38;
nx = 56;
ny = 56;

[x wx dx ddx] = pd('slab',nx);
[y wy dy ddy] = pd('slab',ny);
[evalx psix] = sl('slab',dx,x,1,0,1,0,wx);
[evaly psiy] = sl('slab',dy,y,1,0,1,0,wy);

P = tfun({psix, psiy},[1 2],{wx, wy});
DDX = loper(ddx,1);
DDY = loper(ddy,2);

% Wafer area f = zeros(length(x),length(y));
for i=1:length(x), for j=1:length(y)
    if (x(i)-0.5)^2+(y(j)-0.5)^2 < Rdim^2, f(i,j)=1.0; end
  end, end Feed_pgrm update_pgrm.m % Programmable reactor actuation model % initial guess for concentration profile a = wip(ones(nx,ny),P);

resid = zeros(nx,ny);
dresid = resid;
clear upnorm
subplot(4,4,5)

for iters = 1:8
``` c0 = 0.1*c; % initial guess for c0

Fig. 8D (Cont. from Fig. 8C)

```
  c = a*P;
for inner = 1:10
%    i = find(Ptot1*c0 > 1);
  j = find(Ptot1*c0 <= 1);

resid(i) = K - Cref*Dw/h*( 2*(c(i)-c0(i))) ...
        + alpha*(c(i)+c0(i))*(Tref-Tw)/(Tref+Tw) );
  dresid(i) = Cref*Dw/h*( 2-alpha*(Tref-Tw)/(Tref+Tw) );
  resid = K-Cref*Dw/h*( 2*(c-c0) + alpha*(c+c0)*(Tref-Tw)/(Tref+Tw) );
  dresid = Cref*Dw/h*( 2-alpha*(Tref-Tw)/(Tref+Tw) )*ones(size(resid));
  resid(j) = K*(Ptot1*c0(j)).^(1/6)-Cref*Dw/h*( 2*(c(j)-c0(j))) ...
        + alpha*(c(j)+c0(j))*(Tref-Tw)/(Tref+Tw) );
  dresid(j) = 1/6*K*Ptot1*(Ptot1*c0(j)).^(-5/6) ...
        + Cref*Dw/h*( 2-alpha*(Tref-Tw)/(Tref+Tw) );
  c0 = c0 - resid./dresid;
  c0(find(c0<0)) = eps;
  c(find(c<0)) = eps;
end %    i = find(Ptot1*c0 > 1);
  j = find(Ptot1*c0 <= 1);
  Rc = zeros(nx,ny);

%   Rc(i)= K;               % (gmol/m^2/s)
  Rc = K*ones(size(c));     % (gmol/m^2/s)
  Rc(j)= K*(Ptot1*c0(j)).^(1/6); % (gmol/m^2/s)

resid = Cref*Dw*h*( DDX*c/w^2 + DDY*c/d^2 ) + Q*sum(gtot,3)*Cref/w/d ...
        - Q*sum(g,3)*Cref.*c/w/d - f.*Rc;

Rproj = wip(resid,P);
  Jac = Cref*Dw*h*( wip(DDX*P,P)/w^2 + wip(DDY*P,P)/d^2 ) ...
        - Q*wip(sum(g,3)*Cref.*P,P)/w/d;

update = msolve(Jac,Rproj);
  upnorm(iters) = sqrt(sum(sum(update.^2)));
  a = a - update;
  c = a*P;
```

Fig. 8E (Cont. from Fig. 8D)

```
errtol = 1e-4;
    semilogy([1:iters],upnorm,'ro',[1 6],[errtol errtol])
title('Update vs. Iteration No.','FontSize',14)
    ylabel('Update','FontSize',14)
    axis([1 6 1e-6 10])
    drawnow if upnorm(iters) <= errtol, break, end
    end a = a.*( fsf(2,size(psix,2))*fsf(2,size(psiy,2))' );
c = a*P;

subplot(2,2,3)
pcolor(y,x,c)
xlabel('y'), ylabel('x')
title('WF_6 Profile','FontSize',14)
caxis([0 0.75*Cfeed])

colorbar

GrowthRate = f.*Rc*MW/rho*60*1e10; % Growth rate Angstroms/min

% minGR = min(min( (GrowthRate(find(GrowthRate>0)) )));
% GrowthRate(find(GrowthRate==0)) = 0.99*minGR;

subplot(2,2,4)
[Y,X] = meshgrid(y,x);
surfl(Y,X,GrowthRate)
% contour(y,x,GrowthRate)
xlabel('y'), ylabel('x')
zlabel('Ang/min')
title('Growth Rate Ang/min','FontSize',14)
```

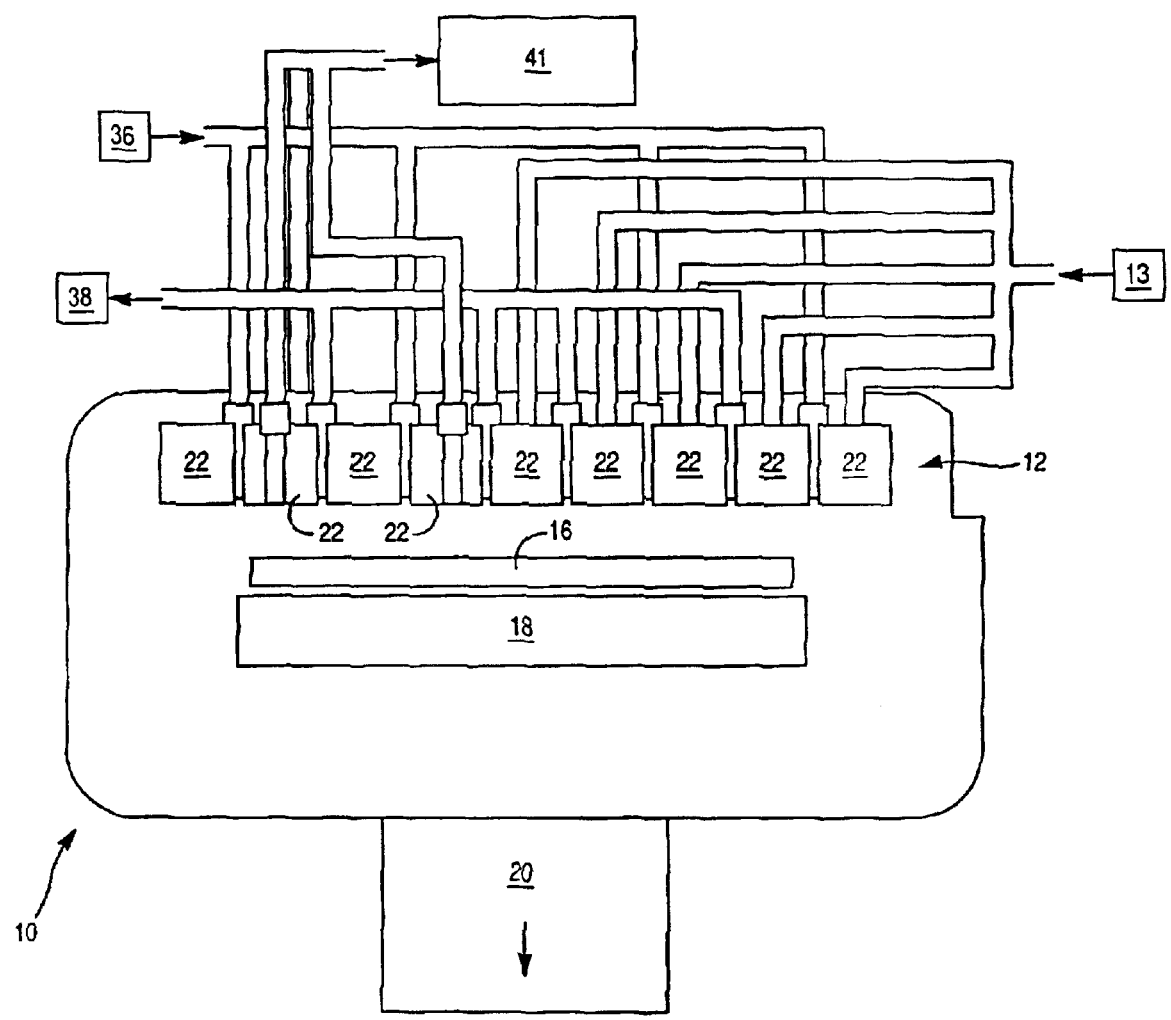

SPATIALLY PROGRAMMABLE MICROELECTRONICS PROCESS EQUIPMENT USING SEGMENTED GAS INJECTION SHOWERHEAD WITH EXHAUST GAS RECIRCULATION

CROSS REFERENCE TO RELATED APPLICATIONS

This application claims benefit under 35 U.S.C. §119(e) of U.S. Provisional Application Ser. No. 60/220,231, filed Jul. 24, 2000 and under 35 U.S.C. §120 of PCT Application Ser. No. PCT/US01/23137, filed Jul. 23, 2001.

FIELD OF THE INVENTION

The invention relates to processes which are used to deposit thin films of materials by processes such as chemical vapor deposition (CVD), in which chemically reactive gaseous species are introduced into the processing environment under controlled conditions of temperatures, gas flow and pressure, and in some cases additional plasma or optical excitation to cause the deposition of desired materials in thin film form on a substrate surface such as a semiconductor wafer. The deposition occurs because of chemical reactions between the gaseous species, usually involving reactions on the surface where deposition is desired, but sometimes involving reactions which occur in the gas phase and lead to formation of new species which then deposit on the surface.

BACKGROUND OF THE INVENTION

CVD is a widely used unit operation in the semiconductor manufacturing industry for thin film device production. The continuing reduction of device feature size and the development of new microelectronic devices have increased the demand for new electronic materials which meet specific materials performance objectives. Common modes of operation include (1) thermal CVD, in which the reaction requires only thermal energy (heating) to proceed, (2) plasma CVD, where a plasma discharge in the gas phase promotes the deposition reaction, and (3) others such as photo-CVD, where the deposition reaction is stimulated by optical excitation. To obtain the desired properties in the deposited thin films of metal, insulator, or semiconductor materials, various combinations of gases and process parameters are required. While selecting these optimal combinations has long been a challenge, to meet the demands of feature size reduction and device performance, the challenge is even greater today as fundamentally new and more complex materials and CVD chemistries are required, both for active devices (e.g., high dielectric constant insulators for FET gates) and for advanced interconnections (including low dielectric constant insulators, copper metallurgy, and metal nitride diffusion barrier layers).

Competitive manufacturing of semiconductors imposes a major additional requirement on CVD processes in the form of manufacturing performance. Silicon wafer sizes are being increased from eight inches to twelve inches diameter in order to reduce the cost per chip, where chips are of order 1 $cm^2$ area each. This increase in wafer size means more than twice the number of chips are now produced per wafer processed. However, the properties of each chip on the wafer must be virtually identical, requiring each process to exhibit uniformity of its metrics across the wafer, e.g., to within 1%. Furthermore, the processing rates must be sufficiently high for rapid deposition and high throughput, as needed for cost minimization. Similar considerations apply in other CVD application areas, such as plasma CVD processing of flat panel displays. Besides plasma-enhanced CVD, plasma etch processes are widely exploited for etching of materials, especially directional etching as needed for the fabrication of submicron device and interconnect structures and present similar problems and consideration.

The various CVD and plasma process modes, described above, have been and are regularly employed in the manufacturing of advanced products. Where the products entail a large area, as in the case of large silicon wafers for semiconductor chips or large glass panels for flat panel displays, the materials performance requirements must be met across a wide spatial extent (8–15 inches) and specified spatial uniformity demands for manufacturing performance.

The conventional approach to achieving simultaneous materials performance and across-wafer uniformity for manufacturing is to design the CVD equipment for single-wafer processing so that gas fluxes impinge as uniformly as possible across the wafer. To attempt to obtain maximum uniformity of gas impingement, some or all of the gases are delivered to the wafer through a showerhead, consisting of a flat plate parallel to and near the wafer surface. The gas passes through a high density of uniformly spaced small holes in the showerhead, thus distributing the gas flow as uniformly as possible across a large diameter wafer. In addition, reactor design components—including chamber, wafer position (and rotation), pumping, heating, and gas inlet—are constructed to attempt to maximize uniformity in terms of 2-D cylindrical symmetry about the wafer.

Various showerhead designs have been developed to attempt to generate uniform gas flow patterns over the wafer surface or for uniform film deposition. The requirement of across-wafer process uniformity has been a major driving force for the industry trend to single-wafer processing and the delivery of gases through a showerhead in relatively close proximity to the wafer surface (from about 2 to 20 mm).

For plasma processing equipment, the power distribution means used to generate the plasma must also be designed to attempt to produce uniform effects across the wafer. Much of plasma processing equipment today is single-wafer. For reactive ion etching and for plasma CVD, gas is introduced through a showerhead parallel to and near the wafer surface. This showerhead serves to distribute the reactant gas species in a relatively uniform manner and also as a counterelectrode for the plasma discharge, with the wafer attached to the other electrode.

Known single-wafer CVD and plasma process equipment using showerhead gas delivery provides a reasonably high degree of symmetry to the process. However, because the gas is introduced as uniform flux but is pumped away at the edges of the wafer, the deposition symmetry is radial, so that nonuniformities are experienced primarily in the radial direction, e.g., thicker films result in the wafer center region relative to the edges. Because the deposition reaction consumes the impinging reactant species, the flow of gases radially across the wafer leads to radial nonuniformities, the extent of which depend on the particular chemical species in use.

A more flexible design to achieve increased radial uniformity for complex CVD chemistries involves a three-zone showerhead as disclosed in U.S. Pat. No. 5,453,124 to Moslehi et al. which has been used for tungsten CVD. In this system, gas is introduced from three independently controlled concentric annular rings, each of which features individual zone feed gas mass flow controllers with potential for real-time control of process gas flows to each annular segment. The center region is circular, while the outer two are doughnut-shaped. By changing the gas flows in one zone relative to another, one can attempt to alter radial profile of deposition rate.

In practice, this has seen limited use for depositing metal compound barrier layers, using a single feed gas and with manually switched flow conductance elements to shorten development cycle time for new process equipment. Although this design has been able to achieve some improved radial uniformity, it still presents significant drawbacks in that it presents a single fixed rather than modular construction, it does not provide for exhaust gas sampling through or real-time sensing in the showerhead, it only permits control of processed gas flows to fixed annular segments, and due to the fact that the gas is pumped away at the edges of the wafer, significant intersegment convective mixing occurs.

Other approaches to controlling process uniformity have been directed to attempting to control spatial distribution of process variables other than gas flow. In rapid thermal processing (RTP), wafers are heated rapidly to reaction temperatures and maintained at these temperatures briefly to accomplish annealing, thermal oxidation, or CVD. In RTP, the key issue is temperature uniformity, both during the reaction and during temperature ramp-up. To compensate for radial temperature nonuniformities during RTP (associated primarily with different heat loss rates at the wafer edge cf. its center), multizone lamp heating arrays have been employed. Radial nonuniformities present a problem in plasma processes as well. Radially symmetric, tunable electrode elements such as those disclosed in U.S. Pat. No. 5,716,486 have been proposed to control both process uniformity and the steady-state particle traps which are formed in plasma processes. In all these cases, the equipment design advances have addressed the compensation of only radial nonuniformities.

Despite prior advances, CVD and plasma processes continue to face a major challenge in achieving uniformity of thin film layers and microstructures across the wafer. The first problem is to achieve such uniformity in the product (silicon wafer, flat panel display, etc.) by appropriate design and operation of the processing equipment, so that desired product performance is attained simultaneously with the uniformity needed for efficient and economical manufacturing. This problem is exacerbated not only by the continuous reduction of microfeature sizes to be manufactured on substrates (e.g., wafers, panels) of increasing overall size, but also by important technology trends and manufacturing considerations in the industry.

One such trend is the prominence of new materials and processes in the industry. For silicon chips, ultrasmall devices now require insulators with dielectric constants much larger than that of conventional silicon dioxide. The solutions now being widely pursued are complex multicomponent materials such as barium strontium titanate, strontium bismuth titanate, or tantalum oxide, materials which may require doping as well. These materials require CVD processes for manufacturability, but their intrinsic complexity (three to five chemical elements) exacerbates the challenge in both process development and manufacturability. For interconnection technology, low dielectric constant materials are being heavily pursued, in part through CVD processes, with similar challenges, along with new materials (metal nitrides for barrier layers, copper for wiring) for the metallic components. The materials complexity involved in deposition reappears in the challenge of etching these materials using plasma processes.

Another trend is the difficulty in co-optimizing materials and manufacturing performance since they often present competing considerations. Given a process chemistry, the design point which is best for materials performance may yield poor uniformity in a specific reactor (or indeed in most or all reactor configurations), while process parameters which achieve high uniformity may produce poor materials performance. Hence it is a common problem that materials performance must be compromised to achieve acceptable manufacturing performance (uniformity). Another trend is the escalating cost of manufacturing process equipment, which now dominates the cost of manufacturing facilities.

In the face of this, it is crucial to use the equipment as efficiently as possible, and in particular to minimize the time in which the equipment must be dedicated to testing process development and refinement as opposed to production of completed products. However, the challenge of new materials places an even heavier burden on experimentation to identify suitable process parameters and recipes to use these new materials. Given these strongly competing considerations, rapid materials and process development, therefore, is increasingly important from a cost perspective. In addition, enterprise costs escalate because the lifetime of equipment is limited to only one or two technology generations since they can be readily or economically be modified after the time an entire new equipment design cycle must be carried out and underwritten.

The use of spatially-programmable process parameters within equipment design for CVD and plasma processes has the ability to significantly improve this situation because spatially-tunable process parameters could be exploited to assure uniformity over a wide range of nominal process design points. In particular, multizone showerheads can ensure that uniformity is obtained at CVD or plasma process conditions desired. However, as embodied in prior known multizone showerheads, several important problems have not yet been solved, or explicitly recognized.

First, interzone mixing sharply diminishes the spatial control which is achievable. For example, the three-zone CVD showerhead design disclosed in U.S. Pat. No. 5,453,124 involves the flow of gas from the wafer center across the outer regions of the wafer. As a result, the impinging fluxes in the outer wafer radial positions are directly influenced by the extent of reaction and the impinging gas flow at the center of the wafer. This mixing also has the effect of reducing the resolution capabilities of gas composition sensing techniques that rely on gas sampling at discrete locations in the gas phase.

Second, spatial programmability of the process is only accomplished in the radial direction. In reality, other sources cause non-radial nonuniformities as well, from the asymmetries of gas flow due to upstream and downstream equipment geometry, to pattern-dependent reaction and depletion caused by the fact that the patterns and pattern density of microstructures on the wafer vary with position.

Lastly, rapid materials and process experimentation is not achieved. Although three zones in the showerhead may allow better control of uniformity, substantial experimentation is still required, and the information contained from varying the relationship of the three zones will not substantially accelerate process learning (in the analysis of both real time sensing and post processing metrology data). Only three zones are involved and the interzone mixing affects the information content in a way which depends on the unknown process chemistry.

The shortened time scales for products in these industries demand more rapid process and product development. In an environment of new materials and processes, this presents a major difficulty, because much experimentation is required, and little fundamental knowledge exists to guide the materials and process development activities. No matter how efficient the design of such experiments may be, the complexity of the new materials combinations to be considered places a heavy burden on comprehensive experimentation which is costly and time-consuming. And even for conventional materials and processes, significant experimentation is required both in development and in manufacturing in order to optimize individual processes for materials performance and manufacturing uniformity, and to adjust the design points for several processes to a system-level optimum as required for process integration and yield.

A fundamental limitation in known conventional experimentation, both in development and in manufacturing, is that many wafers must be processed to acquire an adequate picture of materials and process performance. With single-wafer processing already a dominant trend, industry has begun to show great interest in the development and deployment of advanced process control methods which can assure wafer-to-wafer repeatability in manufacturing. Given this concern, it is clear that sequential processing of multiple wafers incurs inaccuracies associated with wafer-to-wafer variation of process and equipment, presenting a further obstacle to rapid experimentation. The demand for new, more complex materials and processes further exacerbates this problem, but at the same time it opens the door to thinking about strategies for major improvement. One example is that of combinatorial methods, in which many versions of a material are produced in parallel, with gradients of stoichiometry intentionally created across an array of samples. Additionally, few solutions have been proposed to measure uniformity through in-situ and/or real-time sensors, and none for CVD.

It is, therefore, apparent that there is a substantial need in the art to achieve a substantially higher degree of control of process uniformity and to accelerate the process development and optimization cycle by minimizing the experimentation required.

SUMMARY OF THE INVENTION

It is, therefore, an object of the present invention to produce highly controlled spatial distributions of impinging gas fluxes for CVD, plasma and other processes in microelectronics manufacturing equipment. It is another object to enable process uniformity across the wafer/substrate over a broad range of desired process design points, thereby achieving compatible co-optimization of both materials and manufacturing performance. It is yet another object of the present invention to achieve accelerated experimentation and process development by enabling controlled nonuniformity across the wafer/substrate, so that combinatorial methods provide information on multiple experimental design points in each actual experiment on a single wafer. It is a further object to facilitate sensing by gas sampling and installation of other wafer and process state sensors directly above the wafer. It is still a further object to enable the modular design of process gas delivery showerhead devices. It is another object of the present invention to provide each segment of the showerhead with both a gas inlet and a gas exhaust capability that significantly minimizes intersegment mixing. These and other objects of the present invention are realized by a multizone programmable showerhead and method for use in microelectronics processing that allows gas flow rates and compositions to be independently controlled with in each zone or segment without any significant intersegment mixing of gases. In preferred embodiments, each segment is provided with both a gas inlet and a gas exhaust capability that significantly minimizes intersegment mixing. Further preferred embodiments include modular selectively connected showerhead segments and real time gas and optical sampling mechanism associated with each segment which permit collection of real time data concerning processing.

BRIEF DESCRIPTION OF THE DRAWINGS

The foregoing and additional objects and advantages of the invention will become more apparent as the following detailed description is read in conjunction with the accompanying drawing wherein like reference characters denote like parts in all views and wherein:

FIG. 5 is a cross-sectional schematic view of a preferred embodiment of a segmented showerhead system for CVD and plasma process applications of the present invention.

FIG. 8A is a portion of the computer program listing for simulating the effects of using the design of the present invention on a substrate.

FIG. 8B is a continuation of the computer program listing in FIG. 8A.

FIG. 8C is a continuation of the computer program listing in FIG. 8B.

FIG. 8D is a continuation of the computer program listing in FIG. 8C.

FIG. 8E is a continuation of the computer program listing in FIG. 8D.

FIG. 12 is a schematic drawing of an alternative embodiment of the present invention that utilizes optical sensing.

DETAILED DESCRIPTION OF CERTAIN PREFERRED EMBODIMENTS

Figure 1:
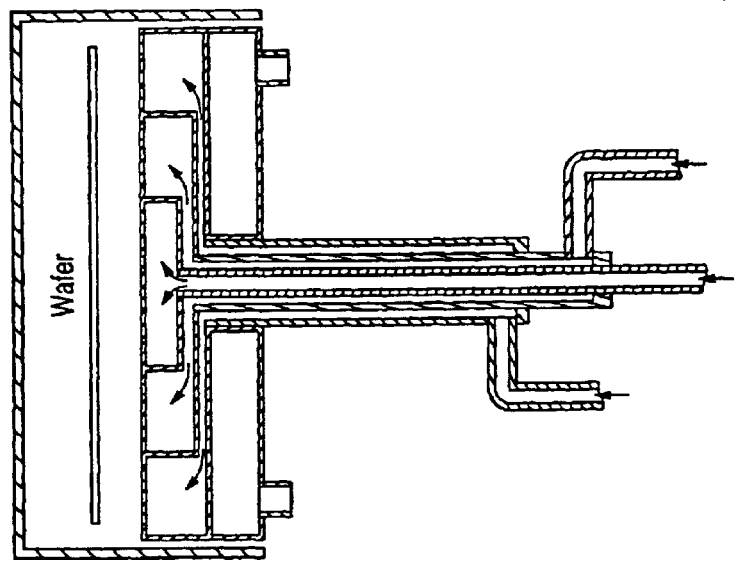
FIG. 1 is an elevation schematic showing in cross section a prior art multizone programmable gas injector showerhead design.

The key to achieving highly controlled spatial distributions of impinging gas fluxes is to prevent or at least substantially minimize intersegment mixing of gas flows. Such mixing of gas flows has been a common problem encountered in prior known devices such as illustrated in FIG. 1. The device illustrated is a three-zone showerhead for CVD processing using concentric annular gas inlet zones (from below) impinging on a wafer held above. The difficulty is that in order for the impinging gas to exit, it all must traverse the wafer surface before being pumped out around the edges of the wafer.

Figure 2A:
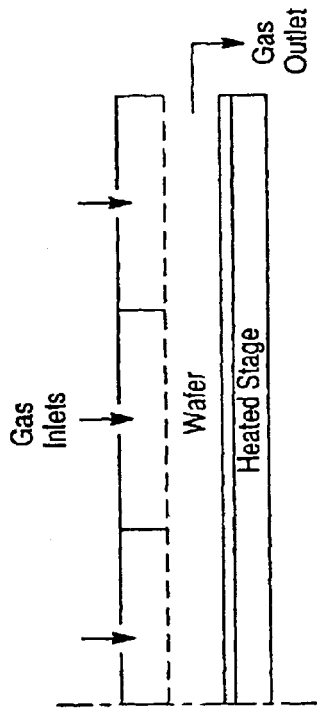
FIG. 2A is a schematic drawing of the prior art showerhead design illustrated in FIG. 1.
Figure 2B:
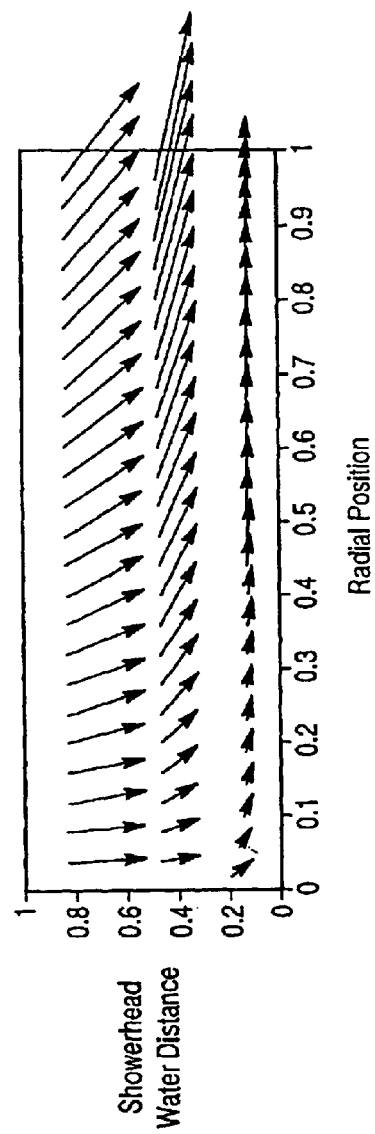
FIG. 2B is a schematic drawing of the flow field of the prior art showerhead design illustrated in FIG. 1.

FIG. 2A is a schematic diagram of the prior art device illustrated in FIG. 1 (depicting the right half of a symmetric system) in a wafer-below/showerhead-above arrangement. The gas inlet and outlet configuration in FIG. 2A is the basis for the model used to calculate the resulting flow patterns in this device as illustrated in FIG. 2B. While gas emerges from all three zones of the showerhead, the gas from the center zone (on left in the figures) must flow radially across the entire wafer surface before being pumped around the wafer edge and out of the reactor. FIG. 2B shows the results of calculations for the flow patterns associated with the structure in FIGS. 1 and 2B, computed using (global) spectral methods to solve the reacting species component conservation equations. When the total flow velocity through the showerhead is held constant across the showerhead (to minimize mixing from shear-induced flow instabilities) and when the reactant species are introduced through a single segment (with inert gas introduced through the other segments) it has been found that the reactant concentration plume in the vicinity of the wafer surface is shifted considerably from the radial location of the source segment, as shown in FIG. 2B. The extent of this shifting effect depends on the total gas feed rate, the showerhead/wafer spacing, and other operating parameters, resulting in an inherent unpredictability of the effects of this design on film deposition properties.

The present invention is directed to gas delivery showerhead assembly and related methods for CVD, plasma and other processing of microelectronics. It is designed as a multizone segmented structure which enables impinging gas fluxes and compositions to be varied independently as a function of position over the wafer/substrate. Segment-to-segment variations in partial or total pressure/gas delivery rates can be made to adjust the impingement distribution in linear, radial, or more complex x-y patterns as desired. These patterns may be chosen to achieve process uniformity at a desired design point or to introduce intentional across-wafer nonuniformity in order to carry out combinatorial experiments in which regions of the wafer represent individual experiments at different process design points.

Each segment of the showerhead includes not only a gas inlet, but also gas exhaust capability, so that a significant fraction of the exhaust gases may be drawn up and pumped out through the showerhead itself. This minimizes intersegment mixing prevalent in prior known devices and enables a high degree of spatial distribution control of the gas flux seen by the wafer/substrate. The present invention also provides a mechanism for spatially-resolved sensing of inlet and exhaust gas streams for chemical sensing, process metrology and control, and process/equipment model validation.

The present invention also relates to plasma processes, in which an electrical discharge is employed to excite a plasma involving the gases introduced into the process reactor in order to accomplish material deposition, etching, oxidation/nitridation, or other modification. A particularly preferred embodiment of the present invention will be specifically discussed in connection with semiconductor chip manufacturing from silicon wafers, but it should be understood that corresponding considerations and conclusions apply to flat panel displays, data storage disks and heads, optoelectronic systems, and other microelectromechanical devices As will be described in more detail to follow, embodiments of the present invention also involve supplementary features, including but not limited to: mechanisms to adjust the dimensions of the showerhead elements and spacing with respect to the wafer/substrate surface; gas distribution and pumping manifolds for the showerhead; chemical and pressure sensors, as well as flow actuation devices; modeling and simulation methods for showerhead design, combinatorial process development, and process learning from data acquired; mechanical designs which enable efficient showerhead fabrication and assembly; and design scaling strategies to achieve showerhead designs with higher spatial resolution (more segments) and lateral extent (for larger wafers/substrates) using meso-scale and microscale components.

Referring specifically to FIGS. 3A, 4, 5 and 7, certain preferred embodiments of the present invention will now be described. Shown in FIGS. 3A, 5 and 7 and generally designated by the reference character 10, is a single-wafer process chamber that is utilized for performing various fabrication processes on semiconductor wafers. As illustrated, chamber 10 is only partially illustrated as encompassing the multizone programmable showerhead 12. The chamber includes a process energy source 14 which is preferably a heat or a plasma generation source that is designed to perform uniform process over a wafer 16. A heat source is usually used in thermally activated processes such as chemical vapor deposition processes. Other process energy sources such as plasma may be employed during other fabrication processes, such as plasma etch and plasma enhanced chemical vapor deposition.

The wafer 16 is supported in an appropriate manner on a stage 18 that is selectively movable to position the wafer 16 a desired distance from the showerhead 12. The stage 18 may incorporate the previously described energy source 14. The process chamber 10 is further provided with a gate valve 20 that can be selectively utilized to exit gases from the chamber 10. The wafer 16 may be clamped against a heated and/or radio frequency powered chuck or it may be supported on several pins without any clamping. The process chamber is well known in its structure and is therefore not shown or described in detail herein.

Figure 3A:
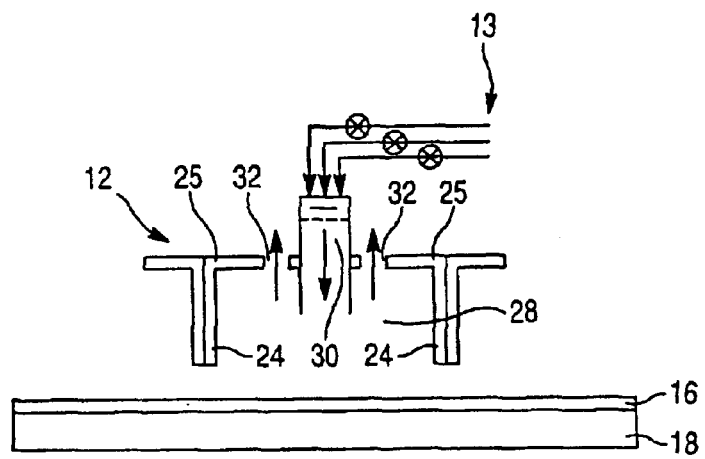
FIG. 3A is a schematic drawing illustrating a preferred embodiment of one segment of a showerhead design of the present invention.
Figure 4:
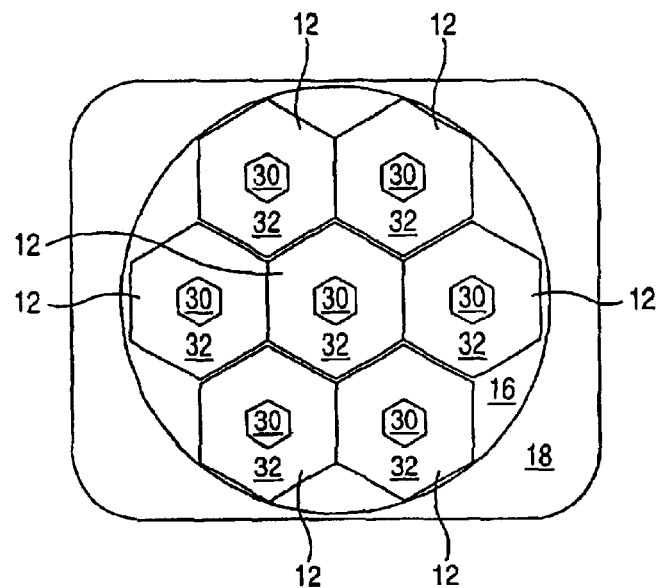
FIG. 4 is a top view schematic drawing illustrating a preferred embodiment of a showerhead design of the present invention.
Figure 7:
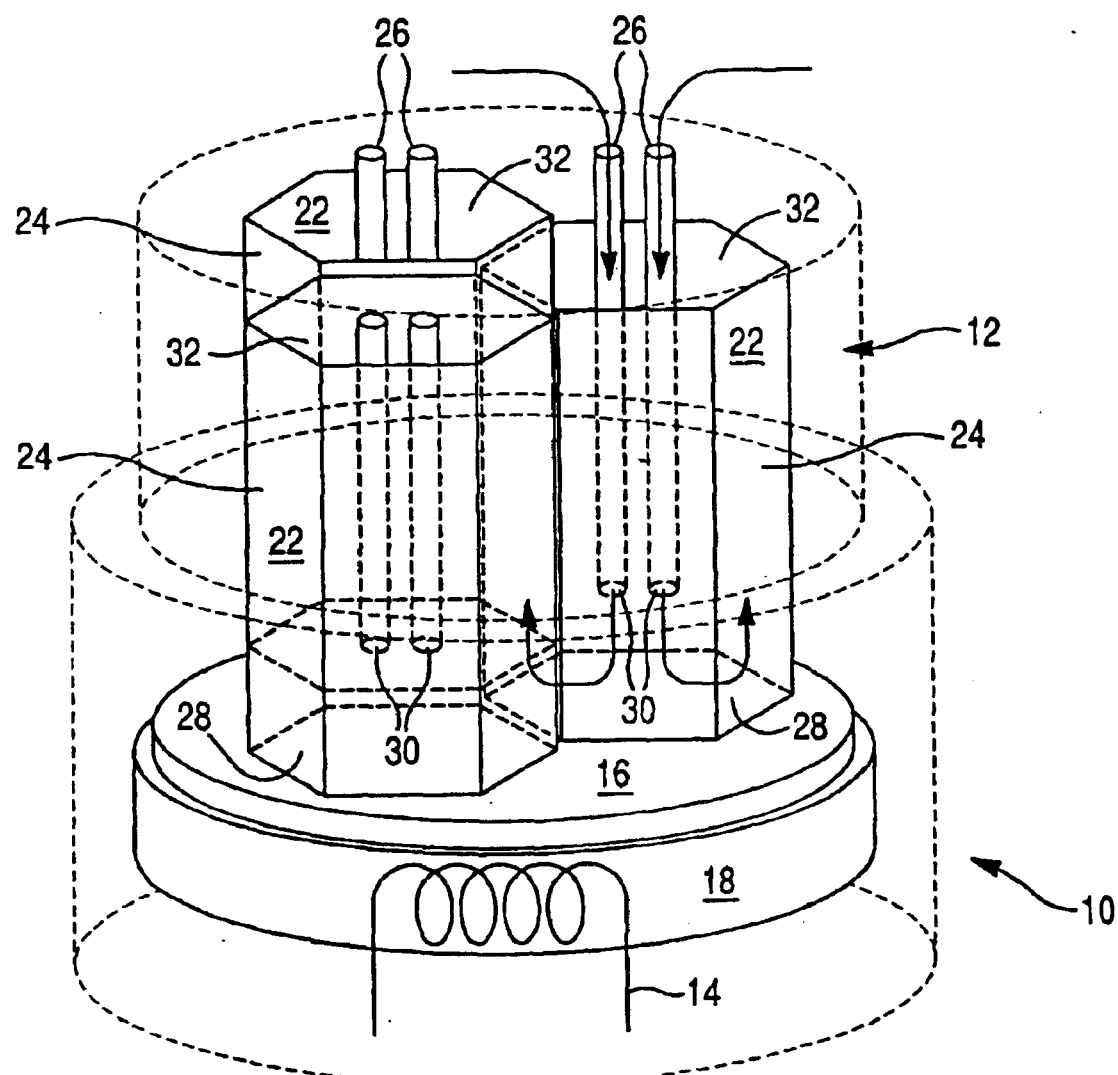
FIG. 7 is a schematic drawing illustrating a preferred embodiment of a pre-segment showerhead system of the present invention.

In preferred embodiments, the multizone showerhead 12 consists of a number of zones or segments 22. Each of the segments 22 has a peripheral wall 24 defining its shape and an interior cavity 28. Each segment 22 is preferably open at its top and bottom as illustrated in FIGS. 4 and 5. Alternatively, a plate 25 can be provided over a portion of the cavity 28 as illustrated in FIG. 3A. Each segment further includes at least one gas inlet 30 and one gas outlet 32. The gas inlet can be provided with the ability to deliver one or multiple flows of gas simultaneously to the cavity 28. This is accomplished by providing a plurality of conduits 26 that extend into the cavity of each segment 22, with the length of each segment is less than that of the wall 24. The conduits 26 may be positioned against one another, as illustrated in FIG. 5, or spaced from one another, as illustrated in FIG. 7. The geometry of the conduits can be tubular or can replicate the geometry of the peripheral wall 24 of the segment 22.

As illustrated in FIG. 5, the conduits are part of a fluid control and distribution network associated with the showerhead 13. As generally indicated by the reference number 13, the flow control and distribution system provides a way of connecting the showerhead 12 with a variety of process gases. The conduits 26 extend from the interior 28 of each segment 12 to a feed gas manifold 15 that contains a plurality of control valve assembly 17 for regulating the flow for each of the respective conduits 26. The manifold 54 is in turn preferably connected to mass flow controllers 19 which selectively regulate the flow of each particular gas to each of the conduits 26 and segments 22. Gas is supplied to the mass flow controllers 19 from a gas storage 21. The control and distribution network 13 can provide separate supplies of multiple process gases to each of the segments 22.

The amount of gas supplied to each segments 22 can be the same or can be intentionally varied. Typical process gases which might be utilized would be, for example, hydrogen, argon, silane ($SiH_4$), tungsten hexaflouride ($WF_6$). Depending on the process, the number of input process gas channels and the number and type of gases may vary. The desired gas flow rates through the system 13 can be varied both prior to and during the execution of any process within the chamber 10. Gas types and volume can be supplied equally to each segment or in any disparate ratio desired. The flow of gases through the system can either be controlled manually or automatically using known methods. Additionally, the operation of the system 13 can also be dependent upon gas analysis data collected from sensors in the showerhead 12 which will be described below.

The gas outlet 32 can take the form of one or more openings in the outer surface, preferably at or near the top of the wall 24, of each segment 22. In preferred embodiments, the gas outlet 32 of each segment 22 extends around the top of the segment from the outer periphery of the inlet 30 to the gas inlet 30 peripheral wall 24 of the segment 22 as illustrated in FIGS. 4, 5 and 7. The gas exiting the cavity 28 of each segment through the gas outlet 32 exits preferably enters into a central exhaust chamber 34. The chamber 34 in turn exhausts gases from the system through one or more ports 35. In an alternative embodiment, the gas outlet 32 of each segment 22 can exhaust the gas into one or more conduits (not shown) rather than the chamber 34.

In the present invention, exhaust gas pumping as well as reactant gas inlet are implemented within each of the segments 22. In this way the flow pattern of the overall showerhead brings a substantial portion of the gases back from the reaction region at the surface of the water through the showerhead 12. This has the effect of significantly reducing intersegment mixing, in that a much smaller amount of exhaust gas traverses the wafer surface below the dividing walls of neighboring segments, compared to the behavior of the prior art devices illustrated in FIGS. 1, 2A and 2B. In other embodiments of the present invention, exhaust gas may be selectively extracted through the showerhead 12 using only some of the segments 22, achieving a portion of the full advantage.

Figure 3B:
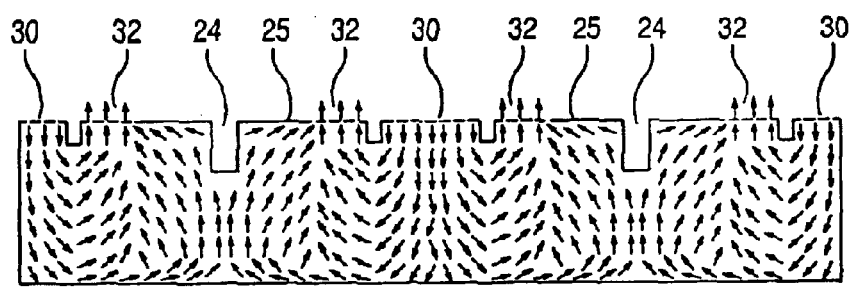
FIG. 3B is a schematic drawing illustrating the flow field for two neighboring showerhead segments of the type illustrated in FIG. 3A.

FIG. 3A illustrates an exemplary structure of an individual showerhead segment 22, which includes a gas inlet and the exhausting of gas from the region above the wafer 16 back through the showerhead segment 12. One primary advantage of the proposed showerhead design is the increased actuator resolution attainable with this configuration. Gas fed and exhausted in each segment effectively results in the creation of periodic boundary conditions for the flow field at each segment wall 24. The computed flow field for two neighboring showerhead segments 12 is illustrated in FIG. 3B. This flow field further demonstrates that intersegment transport of reacting species by diffusion can be controlled by adjusting the height of the showerhead assembly from the wafer surface. The controllability of intersegment mixing afforded by the segments 22 of the showerhead 12 is exploited in achieving across-wafer uniformity. It will be appreciated by those of skill in the art that the benefits of the recirculating showerhead design equally apply in CVD equipment configurations where the wafer is located either above (FIG. 1) or below (FIGS. 3 and 5) the showerhead assembly.

The peripheral wall 24 of each showerhead segment 22 preferably has a shape that permits close packing of the segments 22 across the showerhead. A wide variety of geometries, including square or circular shaped segments, can be utilized. A particularly preferred geometry utilizes hexagonal shaped segments. For each segment 22, inlet gas is delivered to the wafer surface region at or near the center of the segment 22, while exhaust gases from the reaction region just at or above the wafer surface are pumped back up through the segment 22 to a chamber 34 with a showerhead by an external pumping system. With the segments 22 in close proximity to the surface of the wafer, as in conventional showerhead designs, the spacing between the bottom of the segment perimeters and the wafer surface determines the relative role of pumping through the showerhead compared to pumping around the wafer edge.

The segmented design of the showerhead 12 optimizes the density of segments 22 in an x-y addressable array, making possible spatial programmability of impinging gas flux in radial, linear, and more complex patterns across the wafer 16. The showerhead segment 12 is designed as a fundamental modular building block that can be readily expanded and assembled to meet the lateral dimensionality required by the product, whether an 8 inch wafer, a 12 inch wafer, or a larger flat panel display. As an extendable structure built from a fundamental unit, the segmented design of the showerhead can extend equipment lifetime and usage of the showerhead. Some or all of the segments 22 can be preformed as an integral unit from stainless steel or similar materials. Alternatively, each segment 22 can be completely modular with an appropriate connecting mechanism on the outer portion of the wall 24 to permit segments to be selectively attached to or uncoupled from neighboring segments. Optional spacers can also be provided between neighboring segments if desired.

Figure 3C:
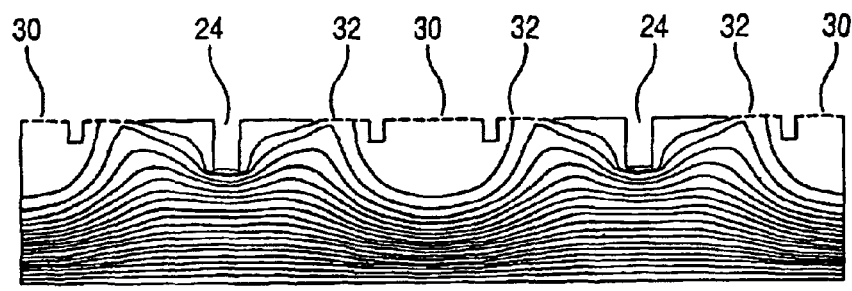
FIG. 3C is a schematic drawing illustrating the temperature field for neighboring showerhead segments of the type illustrated in FIG. 3A.

Under typical operating conditions, heat transfer up through the segmented showerhead 12 introduces no additional temperature-induced convection or other adverse effects compared to known conventional showerhead designs. FIG. 3C illustrates exemplary temperature field for the present invention that corresponds to the operating conditions that produce the flow field illustrated in FIG. 3B. Furthermore, the complete showerhead assembly may also optionally incorporate active heating/cooling mechanisms to prevent reactant gas condensation/reaction.

The modular design of the showerhead 12 provides the additional benefits of accommodating the use of in situ process sensors and thereby simplifying spatial monitoring of residual gas composition. FIG. 5 illustrates three segments 22 of a seven segment system arrangement which are combined to form a multisegment showerhead 12 as previously described, that also analyzes exhaust gases from segment 22 to obtain a measure of the reaction rate as a function of position. Downstream gas sampling using chemical sensing techniques like mass spectrometry have already demonstrated an ability to deliver deposition rate and thickness metrologies for CVD and plasma CVD processes. Any showerhead segment 12 that it is desired to analyze exhaust gases from is provided with a sampling gas exit 40. The exit is preferably located within the cavity 28 of the segment 22 in close proximity to the wafer 16. Each exit 40 is connected to a gas sampling capillary 42. The gas to be sampled is pumped through the sampling capillaries 42 and to a gas analyzer 44 using a multiplexing device 46. A wide variety of known multiplexers and gas analyzers can be effectively utilized in connection with the showerhead 12. A Leybold Inficon Composer and mass spectrometer have been found to be effective for use in connection with the present invention.

Turning now to FIG. 12, another embodiment of the present invention is disclosed where the showerhead 12 is provided with an integrated in situ optical sensing capability. In this embodiment, each of the segments 22 of the showerhead 12 is provided with both an illumination source 36 and an optical sensing element 38. This permits multipoint optical sensing such as full wafer inferometry and spatially resolved process measurements from each segment 22 can be evaluated in real time. This information can be combined with the data from a gas pumping and sensing system referred to generally as 41, as previously described. The optical sensing data from that system can be provided to a control computer for analysis and modeling as will be described below.

The ability to monitor across-wafer uniformity and real time sensing of processing effects is crucial to the present invention to achieve new levels of control and efficiency in semiconductor manufacturing processes. The use of in situ sensors which provide real time measure of exhaust gases in each of the segments 22 of the showerhead 12 along with post-process measurement of across-wafer properties, provide the basis for exploiting advanced modeling methodologies. Integrated model reduction and validation methods benefit from CVD or plasma process systems designed to facilitate model development. Simulator development consists of a three-step procedure: (1) posing a model structure based on modeling those chemical and transport processes that can be accurately characterized; (2) transforming the modeling equations to reduced by discretization; and (3) using this reduced model in an iterative (nonlinear) parameter identification technique to identify model components that may be difficult to determine otherwise. The final step makes use of both in situ (gas sampling and temperature measurements) and ex situ data (deposition thickness, sheet resistance, material phase composition). The reduced models produced by this methodology are used for model-based process control, process optimization, and real-time simulation. This ability obviates the need in prior devices to utilize multiple wafers, reprogram the system, and conduct multiple set-ups to conduct such testing. Even with such efforts, prior devices still could not achieve the highly controlled spatial distributions without significant index segment mixing of the present invention.

Figure 9:
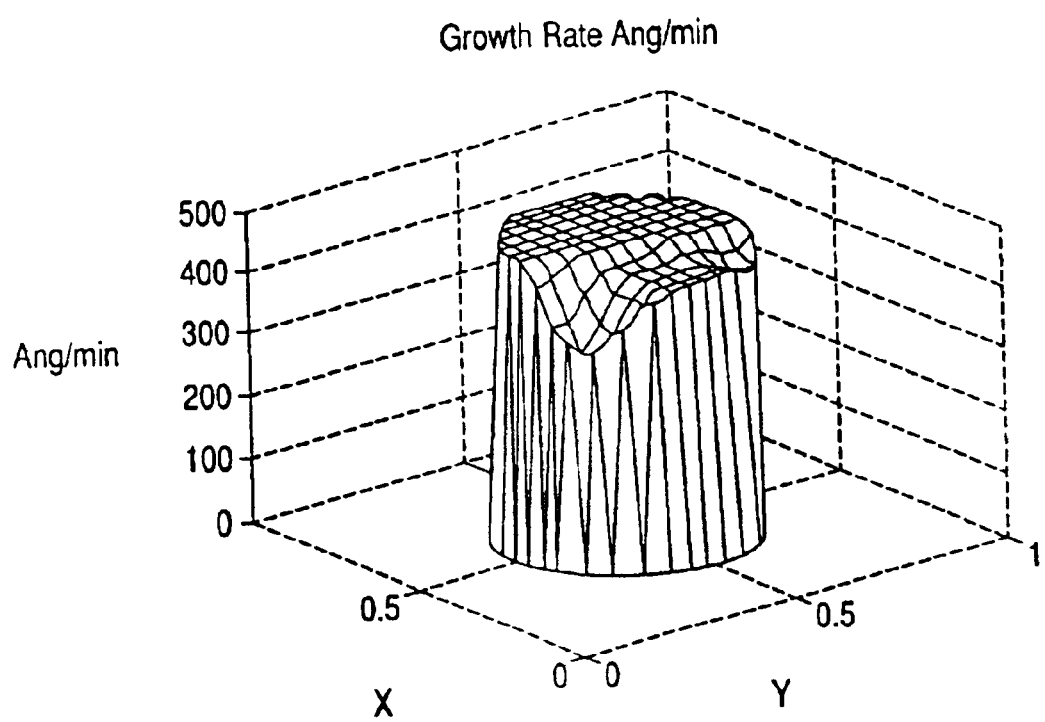
FIG. 9 is a graphical illustration of example of the output of the simulation program illustrated in FIGS. 8A–8E.
Figure 10:
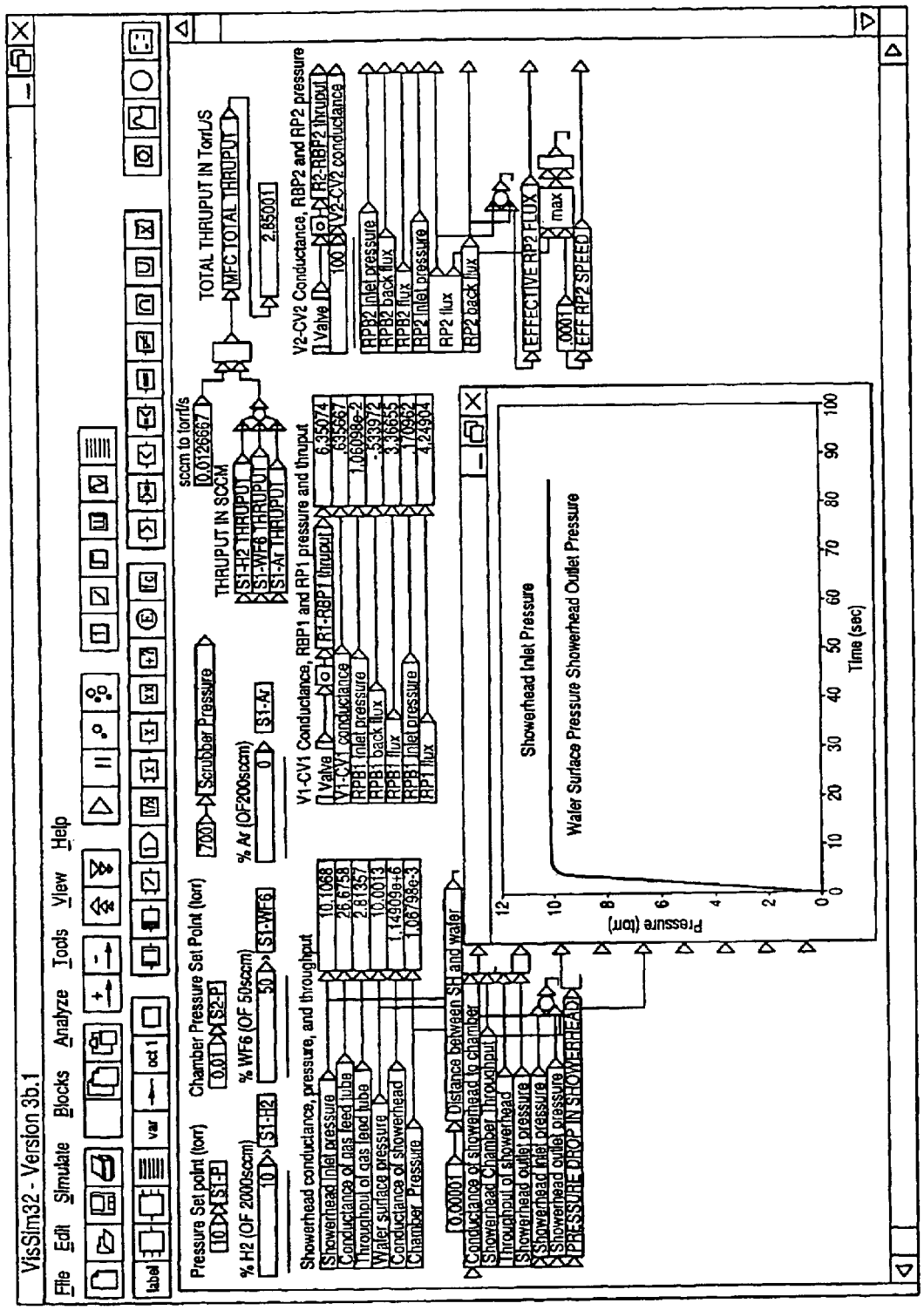
FIG. 10 is an illustration of a typical simulation screen display that can be generated by the present invention.
Figure 11:
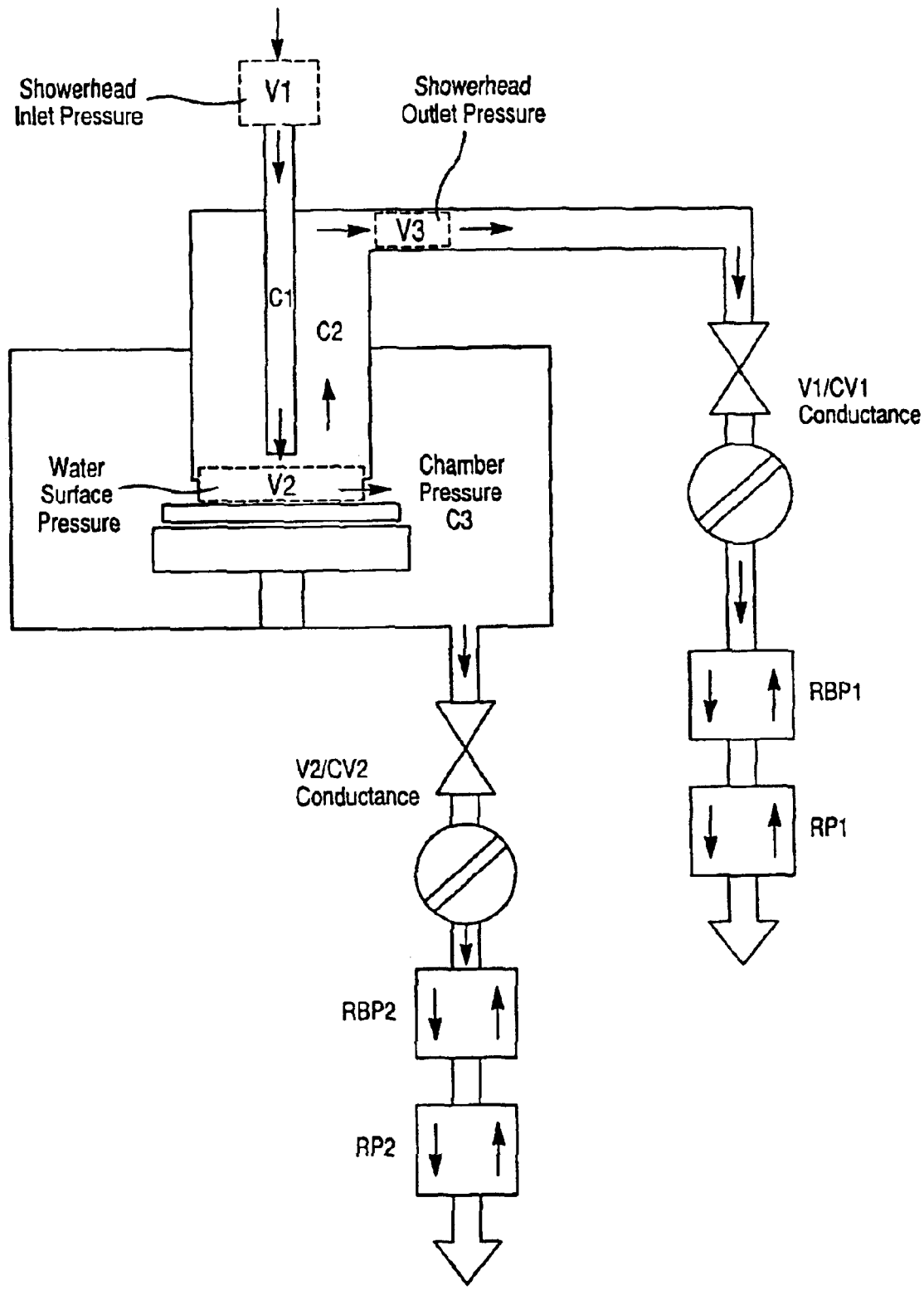
FIG. 11 is a schematic drawing illustrating a single segment showerhead and system model described in the onscreen display illustrated in FIG. 10.

The ability to precisely control the processing in each particular segment 22 of the showerhead 12 and monitor the processing in each segment in real time through analysis of exhaust gases and/or optical sensing permits much greater accuracy, speed and economy in dynamic simulation and optimization of equipment design and processes. FIGS. 8A–8E illustrate a preferred example of a computer program listing for analyzing the segment by segment data that can be realized from the design of the present invention and converts that into a system model. FIG. 9 represents a typical example of a graphical output of the simulation program illustrated in FIGS. 8A–8E that can be generated. This output maps the effect of various processing parameters in a plurality of segments across a single wafer on the thickness and uniformity of the film deposited on the wafer thereon in three dimensions. FIG. 10 illustrates a typical screen display that can be generated utilizing a computer simulation program and data from the present invention. FIG. 11 is a schematic drawing of a single showerhead segment and system model of the type that is referred to in the simulator screen illustrated in FIG. 10. It will be understood by those of skill in the art that the modeling and simulation program and output illustrated and described herein is merely exemplary and that many variations are possible and are also within the scope of the present invention.

With the segmented showerhead design, exploiting exhaust gas pumping through the showerhead 12 as well as a flexible spatial gas impingement pattern, highly controlled spatial distributions are achieved for CVD and plasma processes. This has two profound consequences. First, the highly controllable design enables significantly increased process uniformity across the substrate or wafer over a broad range of desired process design points, thereby achieving compatible co-optimization of both materials and manufacturing performance. Second, it achieves accelerated experimentation and process development by also enabling controlled nonuniformity across the wafer so that combinatorial methods provide information on multiple experimental design points in each actual experiment. This ability is very important since it permits the ability to test and monitor in real time the materials, consequences of a variety of different process parameters at different locations on a single wafer at the same time.

Figure 6:
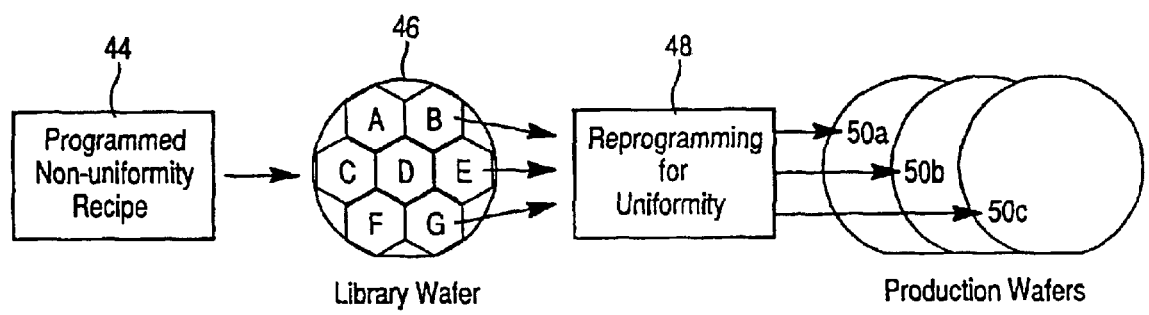
FIG. 6 is a flow diagram illustrating the methodology for using the segmented showerhead design to incorporate intentional nonuniformity across a substrate.

Referring now to FIG. 6, use of the segmented programmable showerhead 12 of the present invention for rapid process development and optimization is schematically illustrated. In this embodiment, the showerhead 12 is provided with seven hexagonally shaped segments 22 (designated as A–G in FIG. 6) that are arranged in order to maximize coverage over a circular wafer 16. Due to the significant reduction or elimination of intersegment mixing between the segments, some or all of the respective segments A, B, C, D, E, F and G, can be intentionally programmed to have nonuniform processing parameters as indicated in box 44, that are not affected by the processing parameters of neighboring segments. By programming in intentional across wafer nonuniformity as described, a library wafer 46 is created which reveals the materials consequences of various process parameters present in the segments A, B, C, D, E, F and G respectfully, which are at different positions on the single wafer 46. This functionality, along with the ability to adjust and achieve close wafer/showerhead spacing permits the granularity of the library wafer 46 to be controlled within a range spanning sharply defined structures such as the hexagonal region depicted in FIG. 6.

Alternatively, by manipulating the space between the showerhead and the wafer, continuously graded wafers that show the effect of gradations of the nonuniform process parameters in the neighboring segments can also be tested on the single library wafer 46. Once the desired material properties are identified and associated with specific process conditions, the showerhead assembly and reactor are reprogrammed to produce uniform films, as indicated in box 48, that have the desired materials properties from the selected segment from the library wafer 46 across the entire wafer surface. This ability is illustrated in FIG. 6 in creation of production wafers 50A, 50B and 50C, respectively, which represent wafers having uniform thin film across the entire wafer surface corresponding to the process conditions of the corresponding segments A, B and C, respectively, of the library wafer 46.

This programmed nonuniformity scenario represents a major advance beyond the conventional approach to process development, particularly well suited to the complexity challenge of new materials and processes and leveraged by both the technology innovation described here and by the combinatorial approach to materials and process discovery.

The capabilities of the present invention illustrated in FIG. 6 also represent a major benefit of the segmented showerhead of the present invention for existing processes. As manufacturing goes through a rapid sequence of product enhancements, individual processes must often be adjusted and reoptimized to raise yields for the revised process flows, a requirement of process integration. For some important cases, the process design point desired for enhancing product performance may be known, but uniformity is inadequate to achieve manufacturing yield. In this case, returning of the gas flux distribution from the segmented showerhead may be the only step required to obtain adequate uniformity at the desired process design point.

While embodiments have been described herein employing conventional gas flow components, other components and system arrangements may be more efficient and cost-effective in more sophisticated embodiments which achieve higher spatial resolution across the wafer and/or larger wafer/substrate sizes. Other embodiments of the present invention also have additional characteristics which will further facilitate scaleup to larger numbers of independently controllable showerhead segments, larger wafer or substrate size, and higher spatial resolution and control. Spatial distribution of inlet and exhaust gas channels, as well as sensor and control means, may be accomplished through a more integrated assembly such as using vertical and horizontal channels in a mechanical structure. With the rapid development of microelectromechanical systems (MEMS) technology, another embodiment of the present invention incorporates MEMS devices into the showerhead, in the form of chemical and optical sensors, pressure sensors, temperature sensors, actuators for flow control, and integrated control systems. Scaleup to larger wafer or substrate size is further facilitated by the use of independent modular showerhead segments which can be readily interconnected and to achieve showerheads as large as required, with each segment incorporating gas inlet and exhaust, sensors, actuators, and control means, along with interconnections automatically made to the corresponding facilities in neighboring segments.

The preferred embodiments described herein relate primarily to two-dimensional distributions of programmable showerhead segments. Such designs are appropriate for the preponderance of practice in current single-wafer processing tools. However, in some cases a one-dimension (linear) distribution of segments may be useful as well, in which the wafer or substrate may pass under the linear showerhead during the process. Although such linear designs have seen limited use, they may have advantages particularly for producing uniform coatings on large substrates.

The embodiments described above provide solutions that achieve a substantially higher degree of control of process uniformity and accelerate the process development and optimization cycle by minimizing the experimentation required. By enabling independent control of the spatial distribution of gas fluxes in independent showerhead segments, it is possible to achieve across-wafer uniformity at whatever nominal process parameter design point is desired, thereby improving materials and product quality and manufacturing yield. This overcomes the current obstacle by which materials and process performance must be a tradeoff against the across-wafer uniformity of the process.

Furthermore, spatial programmability of gas fluxes will also enable the generation of intentional across-wafer non-uniformities. This will facilitate rapid experimentation and process optimization in known materials systems. It will also accelerate materials and process discovery, which is particularly important for the major challenges posed by future technology requirements.

The programmable nonuniformity feature of the present invention may provide benefit in other situations as well, even where the process technology is well known. Many chemical processes exhibit dependence on pattern factors, where process rates or topography vary with the density of patterns on the wafer. In chip designs which involve relatively large regions of one pattern (e.g., memory chips), it may be possible to produce a first-order correction for pattern factor dependence utilizing programmable nonuniformity. Another possibility is that programmable nonuniformity could be used to manufacture wafers with different chip designs at different positions on the wafer, e.g., needing different layer thicknesses on different chips.

The present invention is also believed to be applicable to atomic layer deposition (ALD), as well as to conventional CVD and plasma processes. ALD is drawing great interest because of its ability to achieve high materials quality and process reproducibility. It exploits the self-limiting adsorption of reactants on the surface, exposing the surface to reactants sequentially rather than in parallel. The spatially programmable showerhead described herein is relevant to ALD in several ways. First, while ALD may improve across-wafer uniformity (as well as conformality over 3-D microfeatures), the spatially programmable showerhead could add the benefit of rapid experimentation through use of intentional nonuniform ALD across the wafer. Second, the dominance of exhaust gas pumping through the showerhead segments (compared to the main reactor pumping system) may provide the rapid gas exchange needed between reactant exposure steps to achieve high throughput in ALD, which is normally a low rate process.

Having described various embodiments of the invention, it will be understood that many changes and modifications can be made thereto without departing from the spirit or scope of the invention.

What is claimed is:

1. A multizone gas injector and distribution showerhead for use in microelectronics substrate processing and equipment, comprising:

a plurality of separately programmable segments, each of said segments having a wall with a first end located in proximity of the substrate and a second end spaced from said substrate and an internal cavity between said first and second ends within said wall;

a gas inlet associated with each of said showerhead segments that introduces gases for processing into said cavities; and an exhaust gas outlet associated with each of said showerhead segments, said gas outlet including selectively actuatable removal of some of the exhaust gas from said cavities of said segments through a portion of said showerhead segments other than said first end.

2. The device of claim 1, wherein said exhaust gas outlet is selectively programmable to remove independently variable amount of gas from each of said plurality of said showerhead segments.

3. The device of claim 1, wherein said exhaust gas outlet removes some gas from all of said showerhead segments.

4. The device of claim 1, wherein said plurality of showerhead segments are arranged to enable a variety of gas impingement patterns, including radial and linear distributions.

5. The device of claim 1, wherein said plurality of showerhead segments are arranged to enable a variety of gas impingement patterns, including radial, linear and nonradial, nonlinear x y distributions.

6. The device of claim 1, wherein said segments are modular and can be selectively connected and disconnected.

7. The device of claim 1, wherein the spacing between said showerhead segments can be modified.

8. The device of claim 1, further comprising means for adjusting the distance between the substrate and said gas inlet.

9. The device of claim 1, further comprising means for adjusting the distance between the substrate and said exhaust gas outlet.

10. The device of claim 1, further comprising means for adjusting the distance between said segments and the substrate.

11. The device of claim 1, wherein said gas inlet further comprises a plurality of inlet conduits and arranged to be connected to at least one source of process gas, wherein said source of process fluid is capable of providing a combination of different process gases to said inlet.

12. The device of claim 11, wherein said type of combination of said gas and the pressure and volume of gas can be selectively controlled.

13. The device of claim 12, wherein said type of combination of said gas and the pressure and volume of gas can be independently varied from one segment to the next.

14. The device of claim 1, further comprising sensors, at least one sensor associated with each of said segments for sensing process parameters characteristic in that segment.

15. The device of claim 1, further comprising at least one sensor associated with each of said segments for sensing process parameters characteristic between the substrate and each segment.

16. The device of claim 14 or 15, wherein said sensors include the ability to sample for chemical species, or pressure and generate signals corresponding to these parameters to a central receiving station.

17. The device of claim 16, further comprising actuators to independently modify conditions in respective segments in response to the signals received by the central receiving station.

18. The device of claim 17, wherein said actuators can modify gas flow pressure and temperature within each of said segments.

19. The device of claim 1, further comprising an optical sensing device associated with each of said segments that conveys light from a remote source to the cavity of the segment or to an area of the substrate surface;

means for returning light from these areas to an optical detection system for receiving light from said light returning means.

20. The device of claim 15 or 16, means for processing the signals from said sensors and creating a model of the effects of processing parameters on the substrate.

21. The device of claim 19, a processing means associated with said optical detection for creating a model of the effects of processing parameters on the substrate.

22. The device of claim 1, wherein each of said segments are hexagonally shaped.

23. A multizone gas injector and distribution showerhead for use in microelectronics substrate processing and equipment, comprising:

a plurality of separately programmable modular scalable segments, each of said segments having a wall with a first end located in proximity of the substrate and a second end spaced from said substrate and an internal cavity between said first and second ends within said wall; and wherein showerhead segments to can be selectively joined and removed to enable a variety of segment patterns, including radial and linear patterns.

24. The device of claim 23, wherein said showerhead segments are arranged to enable gas impingement patters, including nonlinear x-y distributions.

25. A method of processing a microelectronics substrate using a multizone gas injector distribution showerhead having a plurality of programmable segments, comprising the steps of:

selectively positioning the showerhead in close proximity to the substrate;

introducing a gas into each of the showerhead segments through one end of said segments, selecting the amount of exhaust gas desired to be removed from each of said segments; and removing exhaust gas from the same segment that said gas was introduced into in response to the selection made in said selection step.

26. The method of claim 25, wherein said removing step involves removing exhaust gas from only some of said showerhead segments.

27. The method of claim 25, further comprising the step of impinging the gas from each of said segments onto the substrate in a consistent radial distribution.

28. The method of claim 25, further comprising the step of impinging the gas from each of said segments onto the substrate in a consistent linear distribution.

29. The method of claim 25, further comprising the step of impinging the gas from each of said segments onto the substrate in a consistent nonlinear, nonradial x-y distribution.

30. The method of claim 25, further comprising the steps of selectively connecting said showerhead segments prior to gas introduction.

31. The method of claim 25, further comprising adjusting the distance between the substrate and the point at which gas is introduced into said segments in said introducing step.

32. The method of claim 25, independently adjusting the type, pressure and volume of gas introduced in said introducing step.

33. The method of claim 25, sensing process parameters characteristic in each of said segments.

34. The method of claim 33, wherein said sensing step includes sensing chemical species, pressure, temperature or volume.

35. The method of claim 25, optically sensing an area of the substrate surface.

36. The method of claim 25, further comprising means for adjusting the distance between the substrate surface and the gas exhaust in the segments.

37. The device of claim 1, wherein the type or combination of gas can be independently varied from one segment to the next.

38. The device of claim 11, wherein the gas flow rate and composition can be varied independently from one segment to the next.

39. A multizone gas injector and distribution showerhead for us in microelectronics substrate processing and equipment, comprising:

a plurality of separately programmable segments, each of said segments having a wall with a first end located in proximity of the substrate and a second end spaced from said substrate and an internal cavity between said first and second ends within said wall;

a gas inlet associated with each of said showerhead segments that introduces gases for processing into said cavities; and a selectively actuatable exhaust gas outlet associated with each of said showerhead segments that removes some of the exhaust gas from said cavities of said segments through a portion of said showerhead segments other than said first end.

40. The device of claim 1, wherein the distance between said gas inlets and said first end of said segments is adjustable.

41. The device of claim 1, wherein the distance between said gas outlets and said first end of said segments is adjustable.

42. The device of claim 14, wherein said sensors sense exhaust as in said segments.

43. The device of claim 25, further comprising the step of sensing the characteristics of the exhaust gas removed in said removing step in at least one segment.

44. The device of claim 43, wherein said sensing step is done in real time.

45. The device of claim 25, further comprising the step of sensing the characteristics of the exhaust gas removed in said removing step in said segments.

46. The device of claim 25, further comprising independently adjusting the composition, pressure or flow rate of gas introduced in each segment in said introducing step.

47. A method of processing a microelectronics substrate using multizone gas injector distribution showerhead having a plurality of programmable segments, comprising the steps of:

selectively positioning the showerhead in close proximity to the substrate;

introducing gas into each of the showerhead segments through one end of said segments;

exiting gas from said showerhead segments toward said substrate; and removing exhaust gas through at least one of said segments that said gas was introduced into.

48. The device of claim 1, wherein each of said gas inlets is separately selectively actuatable.

49. The method of claim 48, wherein said removing step further comprises minimizing intersegment mixing of gas along said substrate.

50. The method of claim 25, wherein said introducing and removing steps provide a symmetry of exhaust gas about the point of introduction of said gas in each segment.

51. The method of claim 48, whereby said introducing and removing steps further comprise steps providing a gas impingement distribution on said substrate that is controllable in two lateral dimensions.

52. The method of claim 48, wherein said introducing and removing steps further comprise providing selective uniformity or non-uniformity of gas impingement on said substrate from segment to segment.

* * * * *